United States Patent [19]

Minahan et al.

[11] Patent Number: 5,279,991
[45] Date of Patent: Jan. 18, 1994

[54] METHOD FOR FABRICATING STACKS OF IC CHIPS BY SEGMENTING A LARGER STACK

[75] Inventors: Joseph A. Minahan, Simi Valley; Angel A. Pepe, Irvine, both of Calif.

[73] Assignee: Irvine Sensors Corporation, Costa Mesa, Calif.

[21] Appl. No.: 996,794

[22] Filed: Dec. 24, 1992

Related U.S. Application Data

[63] Continuation-in-part of Ser. No. 884,719, May 15, 1992, abandoned.

[51] Int. Cl.⁵ ...................... H01L 21/58; H01L 21/60
[52] U.S. Cl. .................................... 437/208; 437/249
[58] Field of Search ...................... 437/208, 249, 915

[56] References Cited

U.S. PATENT DOCUMENTS

| | | | |
|---|---|---|---|
| 4,525,921 | 7/1985 | Carson et al. | 437/228 |
| 4,617,160 | 10/1986 | Belanger et al. | 264/40.1 |
| 4,646,128 | 2/1987 | Carson et al. | 357/74 |
| 4,706,166 | 11/1987 | Go | 361/403 |
| 5,104,820 | 4/1992 | Go et al. | 437/51 |

Primary Examiner—Olik Chaudhuri
Assistant Examiner—David E. Graybill
Attorney, Agent, or Firm—Thomas J. Plante

[57] ABSTRACT

A method for fabricating stacks of IC chips into modules providing high density electronics. A relatively large number of layers are stacked, and then integrated by curing adhesive applied between adjacent layers. A large stack is formed, various processing steps are performed on the access plane face of the large stack, and then the large stack is segmented to form a plurality of smaller, or short, stacks. Means are provided for causing separation of the larger stack into smaller stacks, without disturbing the adhesive which binds the layers within each small stack.

24 Claims, 10 Drawing Sheets

METHOD FOR FABRICATING STACKS OF IC CHIPS BY SEGMENTING A LARGER STACK

This application is a continuation-in-part of application Ser. No. 07/884,719, filed May 15, 1992 now abandoned.

BACKGROUND OF THE INVENTION

This invention relates to the fabrication of three-dimensional electronic packages in which a multiplicity of individual integrated circuit (IC) chips are secured together in a stack which provides a very high density electronic package.

The assignee of this application pioneered the use of IC chip stacks, first as modules providing photo-detector focal plane circuitry, and then as units suitable for computer memories and the like. U.S. Pat. Nos. 4,525,921 and 4,646,128 relate to the stacks designed for general use as memory devices and other non-focal-plane packages.

The methods used for fabricating such three dimensional (3D) IC chip stacks have become increasingly sophisticated. The three dimensional approach has been applied to both SRAM and DRAM memory chips with satisfactory results. Stacking of memory chips has reached density levels of seventy chips in a 0.220 inch × 0.520 inch × 0.520 inch stack, each chip having a 1 megabit memory. Expectations are to increase the memory per chip and the number of chips per stack.

In this approach chips are tested, measured, and then assembled in a stacking fixture, with a thin layer of adhesive between adjacent chips. The stacked chips and fixture are then placed in an oven and baked at the curing temperature for a given time. The "face" of the stack is then etched to expose the thin film metal leads. The leads are of the order of 1 micrometer thick and 125 micrometers wide. After sufficient etching, several layers of passivation, preferably polyimide, are deposited over the stack face, covering to a depth somewhat greater than the length of the exposed thin film metal leads. This polyimide serves as an insulating layer between the silicon chips and the metal pads and/or buslines deposited later in the process. After curing the polyimide layers, the face of the stack is thinly lapped to clear cured polyimide from the thin film metal lead ends.

Using photolithography and vacuum deposition of Ti-W/Au or other suitable metal or metal combination, pads and buslines are formed on the stack face. The pad to metal lead interconnect that is formed is referred to as a "T-connect". Such a T-connect is depicted in FIG. 1. To complete the assembly, the stack can be solder bumped or wire bonded to a substrate for eventual connection to external circuitry. One of these assemblies is shown in common assignee U.S. Pat. No. 4,706,166.

Since memory chip wafers are usually selected "off the shelf", and therefore not dedicated to the stacking process, some modification is required before the die can be used for this purpose. Depending upon how the finished stack is to be attached to its substrate or circuit assembly, it has been found to be appropriate to reroute the pads by thin film metal leads to one edge of the "new" chip. For some applications, however, it may be preferable to reroute to more than one edge of the chip. This wafer lead rerouting process is disclosed in common assignee U.S. Pat. No. 5,104,820.

One of the possible chip stacking processes is disclosed in common assignee U.S. Pat. No. 4,617,160. After a stack has been fabricated, there are several process steps performed on the access plane of the full stack. It is economically no more costly to perform these process steps on a stack containing 70 chips than on a stack containing 10 chips. In fact, it is easier to work with a larger stack because it is easier to handle. These process steps performed on the full stack include those steps discussed above and in U.S. Pat. No. 4,525,921.

SUMMARY OF THE INVENTION

This invention is intended to simplify handling the stacks of chips, and to realize major economies in providing stacks having a relatively small number of chips.

These advantages are obtained by assembling a "large" stack, i.e., a stack having a relatively large number of chips, processing one or more access planes of the large stack, and then separating the large stack into a plurality of smaller stacks.

The necessary processing steps are performed on the larger stack. Subsequently, it is separated into several small stacks by one of several possible separation methods. The smaller stacks are then available for use in environments having limited "headroom". The small stacks may contain chips which are parallel to their supporting substrate (the "pancake" stack), or they may contain chips which are perpendicular to their supporting substrate (the "sliced bread" stack). However, the small stacks are more likely to have the "pancake" configuration.

DESCRIPTION OF SPECIFIC EMBODIMENTS

Short stacks are needed for those applications where headroom is a major constraint. The preferred fabricating process is to build the conventional stack and then to separate the stack into multiple short stacks after completion of stack processing. In this case, the full stack should be readily divisible into several short stacks. This has been accomplished using a thermoplastic adhesive on the plane between the short stacks, heating to the adhesive's softening temperature, and applying a shear force to slide one short stack off another. The adhesive bonding of the chips within the short stack is of course still rigid and unaffected by the shear force. The individual short stacks are then bonded to a suitable substrate.

Various other methods of stack separation, i.e., segmentation of a large stack into a plurality of small stacks, may be used. It is possible that the short stacks may be separated by a cutting process, e.g., by sawing or laser cutting. However, a problem with such separation methods is that electrical leads may be damaged.

As discussed below, recent experiments have demonstrated that the short stacks incorporated in the large stack may abut one another during the integration of the large stack, without requiring adhesive between the short stacks.

Figure 2:
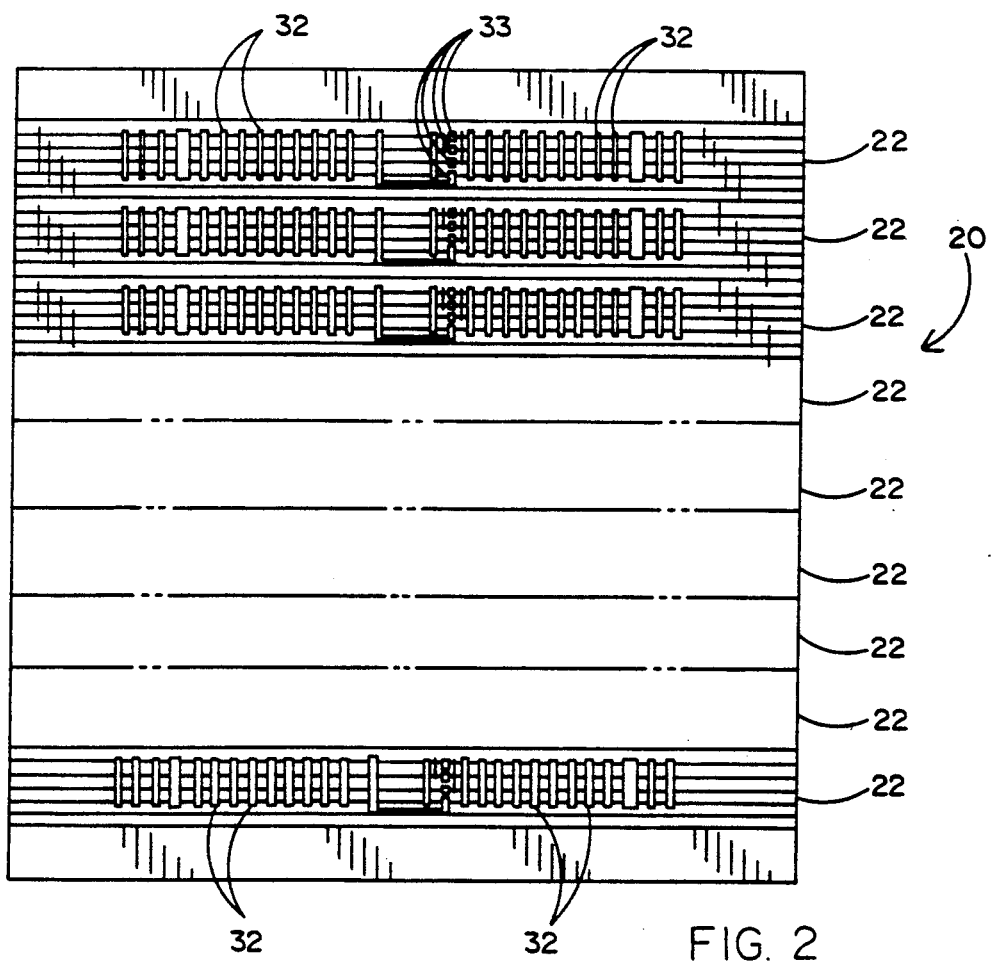
FIG. 2 is a front view of the access plane of a large stack of chips, on which all processing has been completed.
Figure 3:
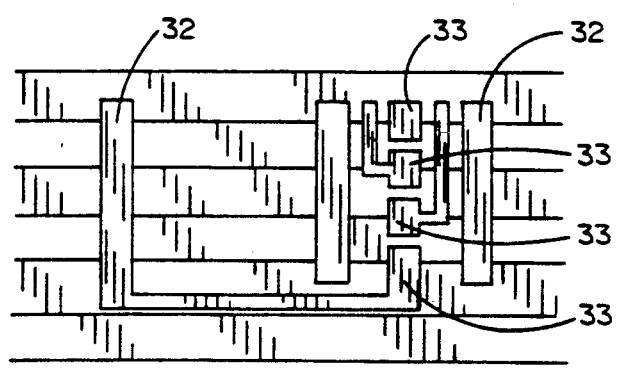
FIG. 3 is a closeup of the metalization at the center of a short stack included in FIG. 2.
Figure 4:
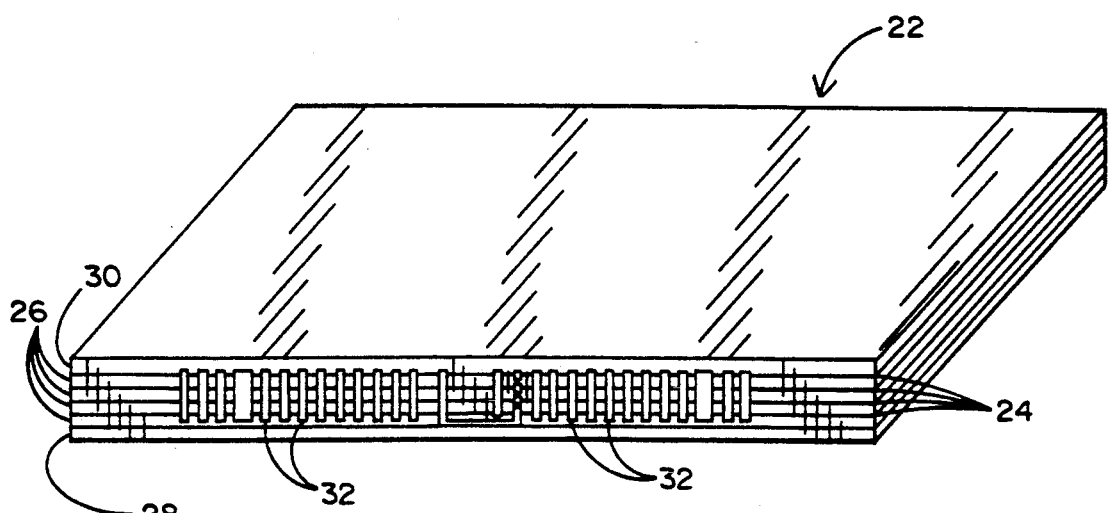
FIG. 4 is an isometric view of a short stack of chips, which has been separated from the large stack shown in FIG. 2.

FIGS. 2-4 show the end results of the processing in which short stacks are formed by segmenting a large stack. In FIG. 2, a large stack 20 has been prepared, and is ready for segmentation. A separation tool is used on the large stack 20 to remove the short stack 22 shown in FIG. 4. The front plane of the stacks, as seen in FIGS. 2 and 4, is the access plane for connection of external circuitry.

The short stack in FIG. 4 has four lead-carrying surfaces 24 formed on four active chip layers 26. Two inactive (non-chip) layers 28 and 30 are located at the bottom and top, respectively, of the short stack. They allow the active chips to be isolated from exterior circuitry, except for the metalization formed on the access plane.

The large stack 20 in FIG. 2 provides 9 short stacks 22, each having four active chips. The number of chips in the large stack and in the small stack can be varied to suit particular stack fabrication needs. It is assumed, however, that each of the multiple short stacks formed from a given large stack will normally be identical in size.

The chip combinations contained within the short stacks have numerous potential variations. Generally they contain from 4 to 10 memory IC chips. The short stacks may also contain an ASIC chip, and may be designed to permit embedding a decoupling capacitor inside the short stack.

As seen in FIGS. 2 and 4, the access plane of the large and small stacks has electrically conductive metallization formed thereon, in the form of numerous vertically extending buses 32, and pads 33 which separately access each chip. These buses and pads are electrically connected to the circuitry embedded in the stacks, by means of a multiplicity of T-connects of the type shown in FIG. 1. FIG. 3 is a closeup which shows more clearly the separate pads 33 which access each chip individually. The buses 32 and the leads which reach the pads 33 are used to provide conductive paths leading to exterior circuitry.

Figure 1:
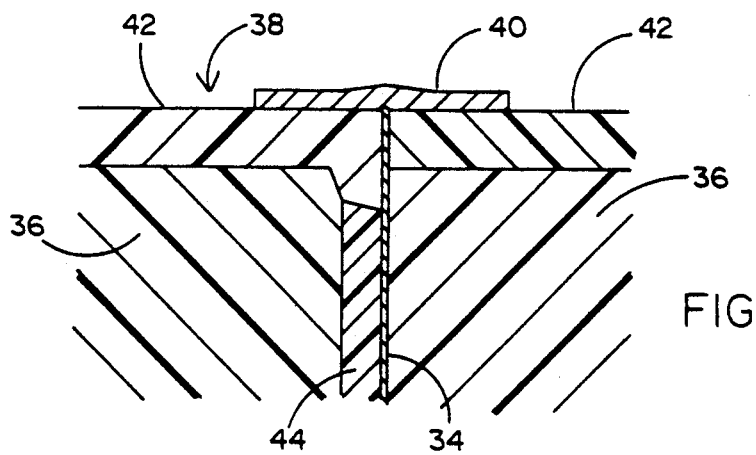
FIG. 1 is a section through adjacent chips showing a T-connect formed (by application of metal pads) on an access plane of a stack of chips.

In FIG. 1, an electrical lead 34 extending from the IC circuitry in a chip 36 reaches the surface of the access plane 38, where it is joined to metallization 40, which may be a terminal pad or a bus, or a combination of pad and bus. The T-connect provides an effective electrical contact. A passivation layer 42 lies between the access plane surface of the chips 36 and the metallization 40. This is necessary to avoid short-circuiting by the silicon semiconductor material of the chips. A layer 44 of adhesive material secures together the adjacent chips 36. Insulating material (not visible in the figure) is provided on each flat surface of each chip 36.

The earlier common assignee patents referenced above deal with (a) the preparation of the chips for stacking, (b) the forming of the chips into a stack having adhesive material retaining the chips in the stack, and (c) the preparation of the access plane of the stack for metallization to create electrical communication with exterior circuitry. If desired, a stack of chips may have more than one access plane connected to exterior circuitry.

The advantages of working with a large stack, even though the desire end result is a plurality of short stacks, include both ease of handling a larger stack and significant cost cutting due to having a single series of access plane processing steps.

Before describing the series of processing steps performed on the large stack prior to segmentation, it will be useful to consider the chronology of stack separation efforts which have been performed over a multi-year period prior to this application. An early idea was to use an adhesive that could be cured during the stacking process, but then dissolved in a solvent after completion of the stack processing. The material chosen for this work was a high vacuum leak sealant that, even after curing, was soluble in xylene, methyl ethyl ketone, or "Freon". A dummy stack was separated into short stacks using this approach, but the method was found to be very time consuming; and it required the application of some force.

Later, a full stack of layers was successfully separated into eight short stacks. Epoxy was used as the permanent adhesive, and hivac leak sealant was used as the separable adhesive. "Freon" was used as the solvent of choice for separation. A shallow saw cut was made around the periphery of the stack at the separation boundary. This served three purposes: it severed the polyimide passivant, it provided a limited channel for the solvent to work on the adhesive, and it provided a "cleavage line" for application of force to accomplish separation. The force was applied to a sharp knife blade positioned in the groove generated by the saw.

Further experimentation covered concepts of using thermal shear of an organic (e.g., a polyimide) or a low temperature melting point metal. This program was very successful in providing short stacks for some very specific experiments regarding T-connect resistance and integrity, acting as a foundation for extensive experiments on thermal cycling of the T-connects.

As stated above, recently successful experiments have been carried out where adhesives are not used between short stacks as the chips are placed in the fixture which retains the large stack during the curing process. In that case, the segmentation process is no longer needed for final separation of the short stacks.

Figure 5:
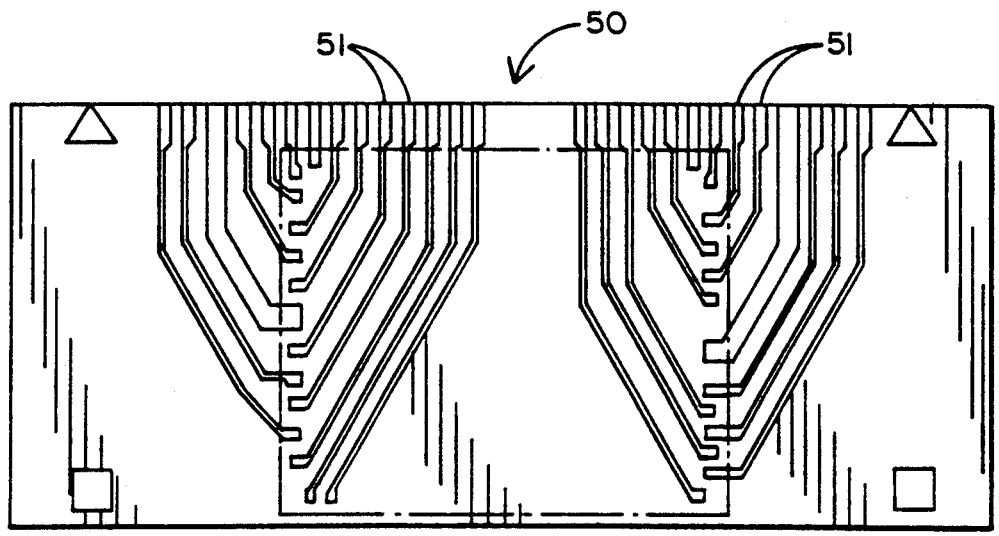
FIG. 5, which is similar to FIG. 4 in U.S. Pat. No. 5,104,820, shows a single chip ready for stacking, after wafer lead rerouting.

The following description of the presently preferred large stack/short stack process begins with the assumption that the individual IC chips have been prepared for stacking. FIG. 5 shows a single chip 50, which has been cut from a wafer after a lead rerouting process which brings each lead 51 to the same edge of the chip. As an example, the number of such leads on one edge of a given chip may be about 30, assuming a spacing of 15 mils between adjacent leads. The area of a chip such as the one shown in FIG. 4 may be about 0.220 inch by 0.520 inch. The reason for the length-to-width ratio is the wafer rerouting process. This process, which is preferred for forming stacks of memory chips, permits using wafers of the type which are commercially available. In instances where custom-designed chips are used, e.g., focal plane modules, the chip areas usually are approximately square. Some of the figures in this application show chips which are approximately square. The difference in chip area does not change the nature of the processing steps.

Figure 6:
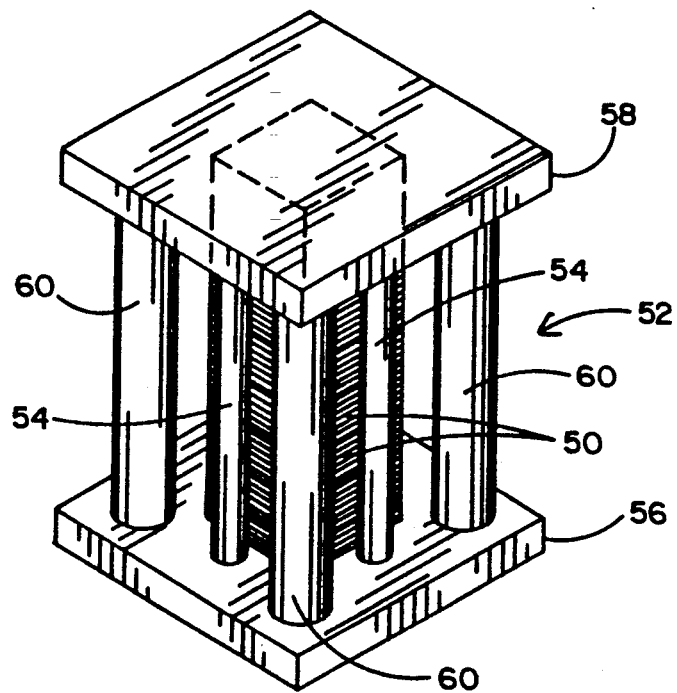
FIG. 6 is an isometric view showing a large number of chips stacked in a fixture which holds them during the curing process which sets the glue between adjacent chips.

In FIG. 6, a large number of chips 50 have been stacked in a fixture 52. They are prevented from movement along the X-axis and Y-axis by a plurality of round vertical posts 54; and they are prevented from movement along the Z-axis by a lower plate 56 and an upper plate 58. The distance between the plates 56 and 58 is determined by a plurality of spacer posts 60. During stacking of the chips, the upper plate 58 and the spacer posts 60 are not present in the structure.

Chips are placed one by one into the stacking fixture in prearranged order. Before each chip placement a specified quantity of adhesive material is dispensed on top of the uppermost chip. In placing one chip over another, a slight force is exerted on the top side of the chip to distribute adhesive more evenly over the surface below. After the top cap chip for a short stack has been placed in position, a "sacrificial" adhesive is applied to the chip surface in place of the usual adhesive. The bottom cap chip for the next short stack is then placed on the stack. The adhesive placed on this chip is again the permanent adhesive, and so on, using the sacrificial adhesive only on the planes where stack separation is planned. This sequence is continued until all chips have been placed in the stack. Of course, no sacrificial adhesive is used, if adjacent small stacks are mechanically held in engagement.

After stacking, the fixture undergoes thermal treatment in an oven to cure the adhesive. Force applied to the stack along the Z-axis causes some flow of the adhesive, reducing glue line thickness to a desirable dimension, and filling in voids resulting from the chips' metal line topology. Time and temperature regimes are dependent upon the adhesives chosen for chip bonding. A second oven anneal may be required if the adhesive cure temperature is lower than the cure temperature required for imidization of the passivant layer deposited later in the process sequence.

Figure 7:
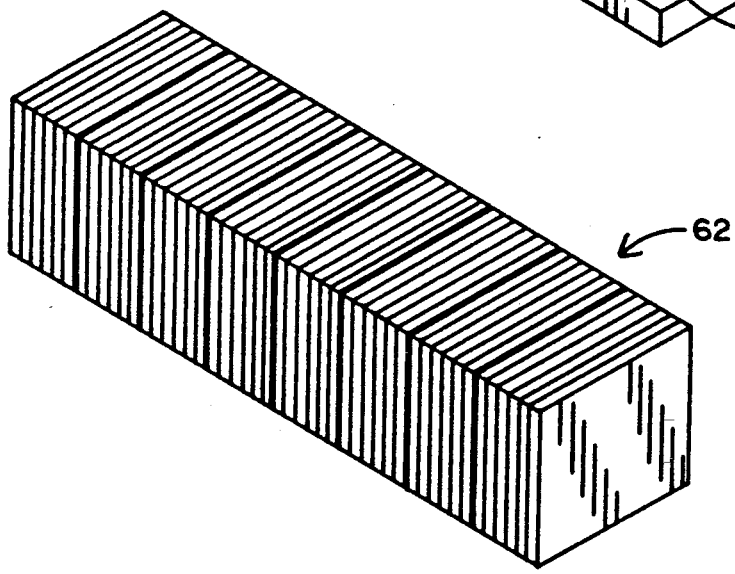
FIG. 7 is an isometric view of the large stack after its removal from the fixture of FIG. 6.

After the adhesive curing process, the stack is removed from fixture 52, providing the large stack 62 shown in FIG. 7.

After completion of the cure cycle(s), the large stack 62 must be lapped to remove cured, extruded adhesive, and to provide a suitable, flat reference surface for all subsequent processes. The stack is lapped until all of the chips' metal extension lead ends are visible, intersecting the lapped silicon surface.

Figure 8:
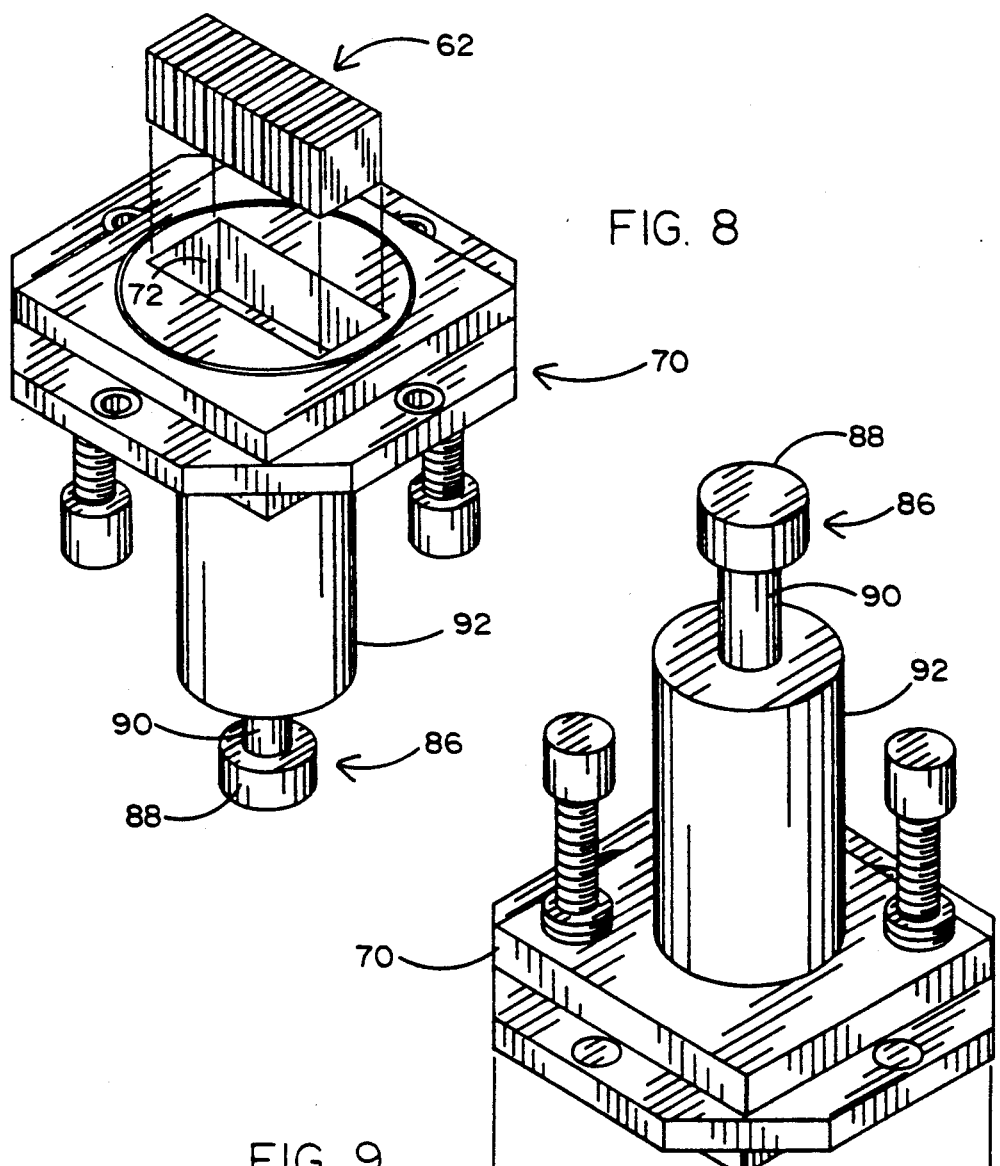
FIGS. 8-10 show the fixtures and apparatus used during lapping of the access plane face of the large stack.
Figure 9:
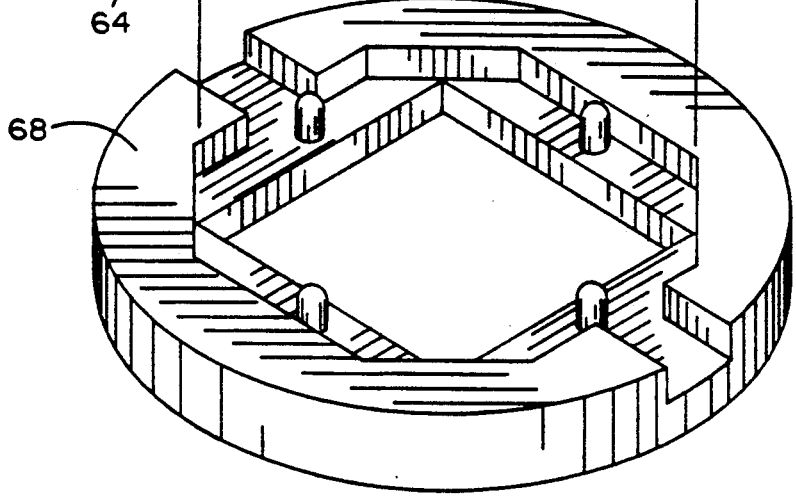
Figure 10:
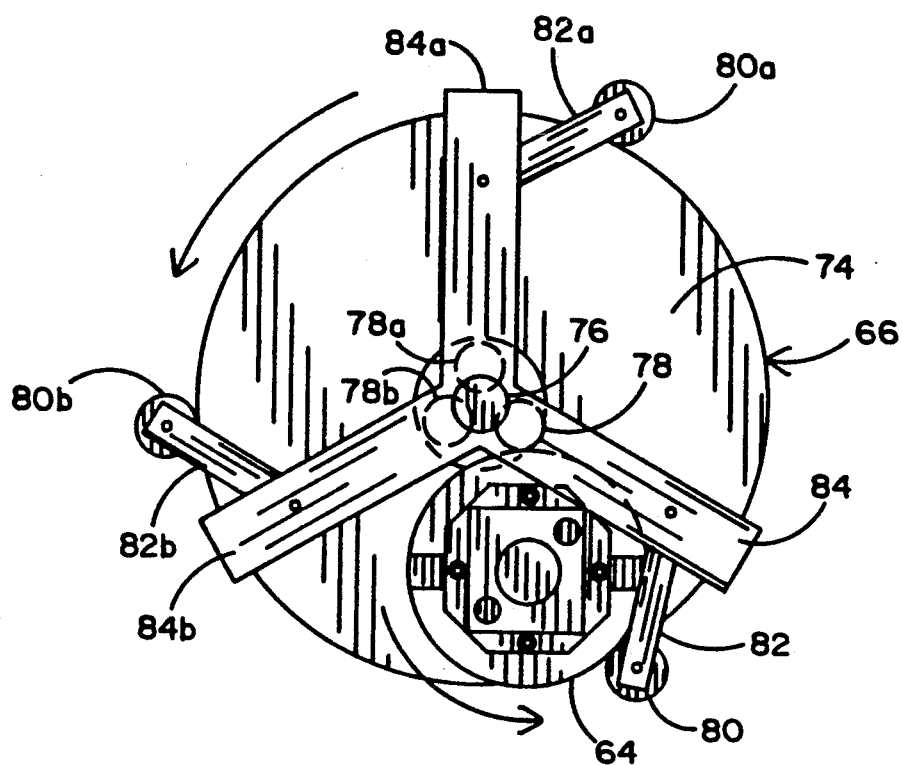

The lapping process requires an apparatus which retains the large stack 62 in precise position while material is removed from its access plane surface. A suitable lapping apparatus is shown in FIGS. 8-10. As seen in FIGS. 8 and 9, a holding fixture 64 is used to retain the large stack 62 in position during the lapping. FIG. 10, which is drawn to a much smaller scale than FIGS. 8 and 9, shows the holding fixture 64 in position on top of, and in engagement with, a lapping wheel 66.

As seen in FIG. 9, the holding fixture 64 comprises an annular outer portion 68 and an inner portion 70 which fits into, and rotates with, the outer portion 68. In FIG. 8, the inner portion 70 is upside down, in order to show a recess 72, into which the large chip stack 62 is inserted for retention during the lapping process. With the large stack 62 held in position by set screws (not shown), the inner portion 70 of holder 64 is inverted, and inserted into the outer portion 68, as shown in FIG. 9.

Referring to FIG. 10, the lapping wheel 66 is caused to rotate in a counterclockwise direction by a motor (not shown). Means are provided (not shown) for applying to the upper surface 74 of wheel 66 a lapping compound which will remove material from the access plane face of short stack 62.

A spindle 76, driven by the same motor which rotates wheel 66, drives a small wheel 78, which engages the periphery of fixture 64, and causes fixture 64 to move in a counterclockwise direction. A small rubber wheel 80, carried by a rigid arm 82 on a supporting plate 84, holds fixture 64 in engagement with driving wheel 78. A total of three fixtures 64 can be simultaneously mounted in place on wheel 66. The second and third fixtures would be driven by small wheels 78a and 78b, respectively; and they would be held in place by rubber wheels 80a and 80b, respectively.

Although fixture 64 engages the surface 74 of wheel 66, the material of the fixture is only slightly affected by the abrasive effect of the slurry material. The access plane surface of the large stack is held down against the wheel surface 74 by the relatively light weight of a member 86 (FIGS. 8 and 9) having a head 88 on a stem 90, which is able to move vertically within a cylindrical extension 92 of the inner portion 70 of holding fixture 64.

Figure 15:
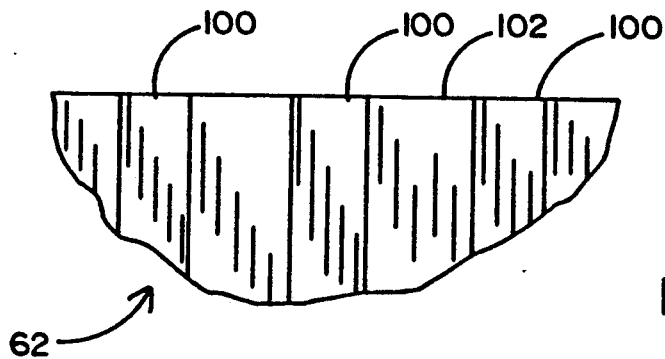
FIGS. 15-18 show a closeup of leads at the access plane face of the large stack after successive steps in the processing of the large stack.

Completion of the lapping of the access plane face of the large stack 62 causes the electrical leads in the stack to be flush with the surface of the access plane, as seen in FIG. 15. Three leads 100 are shown, which extend to the access plane 102.

Figure 16:
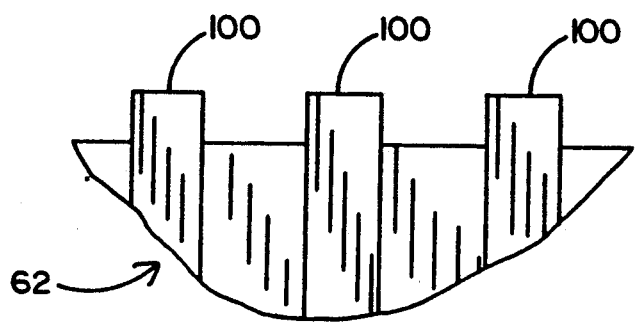

The next process step is removal of some silicon from the chip edges at the access plane. This is part of the process of insulating the semiconductor material of the chips 36 (in FIG. 1) from the electrical leads 34 which extend to the access plane 38. Removal of the silicon material does not affect the electrical leads, which are caused to protrude, as shown in FIG. 16.

Etching to remove some silicon on the access plane may be accomplished by a process of "wet etching". In this process, the access plane side of the large stack is briefly (for a designated length of time) dipped into a container having an etching liquid. The large stack may be supported from above by tongs, or "tweezers". Care is exercised to obtain only the necessary depth of etching, and to maintain a level surface of the exposed silicon.

The generally preferred method of etching away some silicon from the access plane of the large stack is "plasma etching". In this process, the stack is placed in a copper plasma etch fixture, which is then placed in a water-cooled copper holder within the plasma etcher.

The lapped stack surface is free of the fixture and both below and parallel to the plane of the etcher plate electrode.

Figure 11:
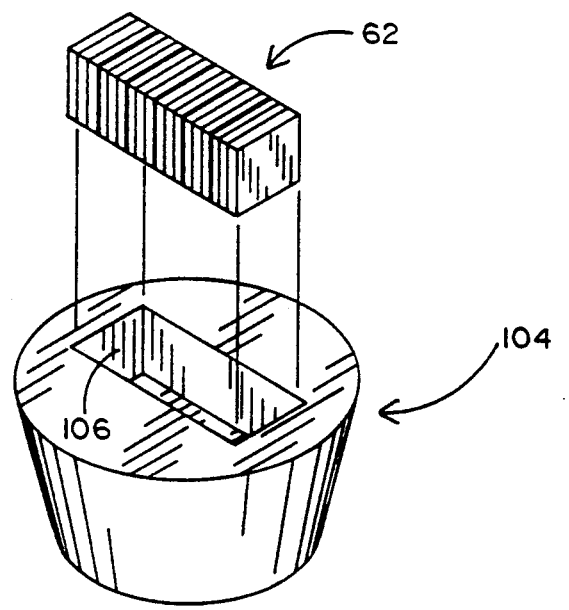
FIGS. 11 and 12 show the apparatus used for etching away some silicon from the access plane face of the large stack.
Figure 12:
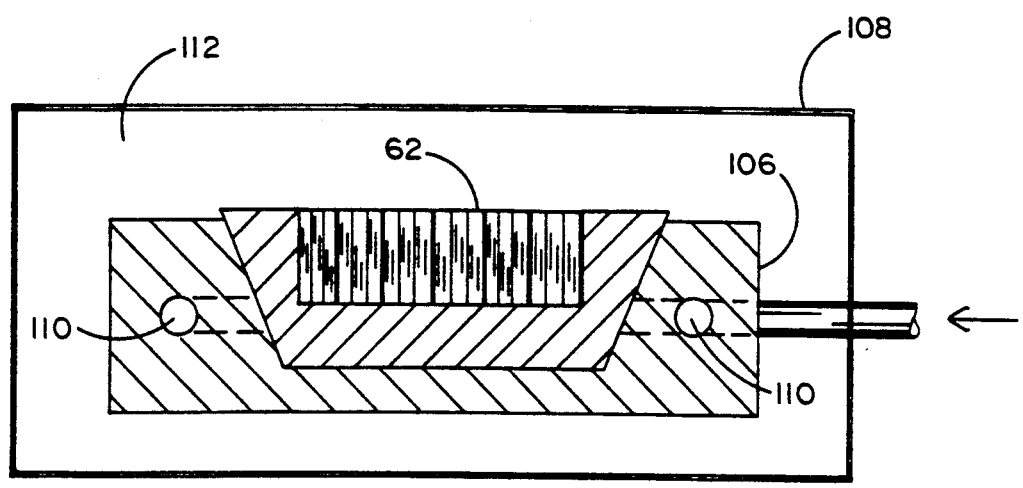

The apparatus used in the plasma etching process is shown in FIGS. 11 and 12. An inner holder 104 has a recess 106, in which the large stack 62 is placed, with its access plane face on top. The inner holder 104 is placed in an outer holder 106, which is mounted inside an enclosure 108. Cooling liquid is caused to flow through passages 110 formed in outer holder 106. Plasma etch gas flow is directed into the chamber 112 formed in enclosure 108. The exposed silicon on the access plane face of the large stack 62 is etched away to cause the leads 100 to extend from the face of the stack, as shown in FIG. 16.

The plasma etch gas flow may be set for 5 cc/min of $C_3F_8$ and 3.7 cc/min of $O_2$. Rf power may be set at 250 watts. The etching may be carried out in time steps of one hour. After each etch period, the length of metal lead extension exposed by etching is measured microscopically by focusing on the lead top and etched silicon surfaces, using the difference as the lead length exposed. After several etching-measuring sequences, the exposed lead length should be in the desired range of 10–15 micrometers. This completes the plasma etching to expose the leads.

The plasma etching may be followed by a flash etch to remove high points of silicon oxide or glass that might have etched more slowly than the silicon. In the case of memory chips, lead modification is normally required. This necessitates etching of any and all metals that may be involved in the chip metallurgy and therefore protruding along with the exposed leads. Generally, this metal is aluminum only. However, there are sometimes cases where other metal systems may be involved, such as the silicides. Those other metals must also be etched away to prevent shorting of the lead extensions. Various strategies must be designed and executed to satisfactorily remove the extraneous and unwanted metals, if any such metals are present.

After the etching processes have been completed, the next step is to cover the access plane face of large stack 62 with insulation (passivation) material to electrically isolate the silicon from the metallic conductors which later will be formed on the access plane surface. FIG. 16 shows a layer of passivation material 116 covering the entire surface of the large stack 62. This material provides insulation between the silicon and the subsequent metallization, and also provides structural support for the exposed metal extension leads 100. The preferred passivation material or materials are selected from the available polyimides.

In forming the layer 116, first a siloxane solution may be deposited and dried on the etched silicon surface. This solution promotes adhesion of polyimide material to the etched silicon surface. Next, under vacuum, a 5:1 (thinned) layer of "Dupont 2555" polyimide may be deposited on the etched stack surface. Vacuum conditions are used for this deposition, in order to prevent bubble formation from the glue line voids. The stack should be spun at a suitable rate for a suitable time period. This should be followed by a partial imidization bake. The bake is performed to remove volatiles from the polyimide layer and, at the same time, to leave a surface to which the next polyimide layer can adhere well. Usually, this reduced layer would be followed by three to five unthinned layers of "Dupont 2555" polyimide. However, recent work has utilized "Dupont 2611D" polyimide for the unthinned polyimide layers, because of its much lower CTE (coefficient of thermal expansion), bringing it closer to the silicon CTE, and hence reducing stress during temperature cycling/escalation, as might be experienced during typical soldering processes.

After each layer of polyimide is put down on the etched face of the large stack 62, partial imidization should be carried out to drive out volatiles, preferably on a hot plate. When sufficient polyimide layers have been put down to fully cover the exposed metal lead extensions 100, complete imidization should be carried out, again on a hot plate with the passivated side facing upward.

Figure 13:
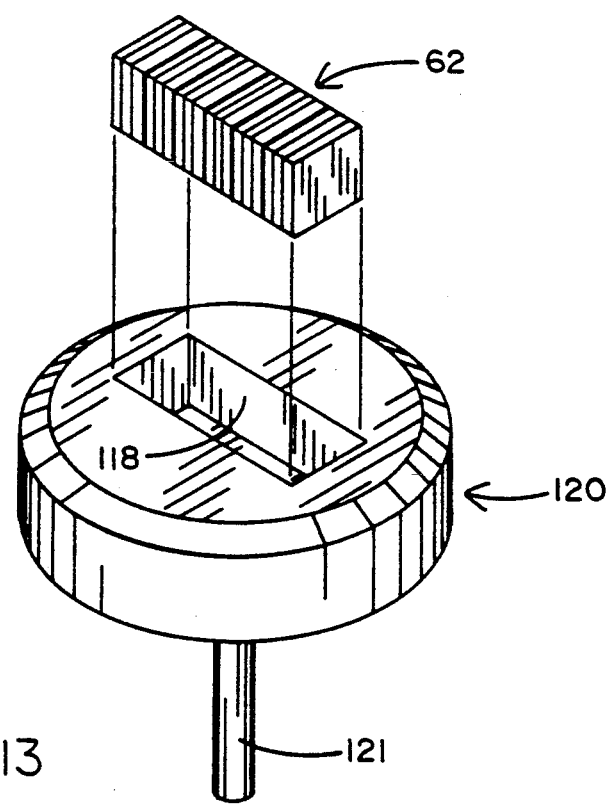
FIGS. 13 and 14 show the apparatus used to apply passivation on the access plane face of the large stack.
Figure 14:
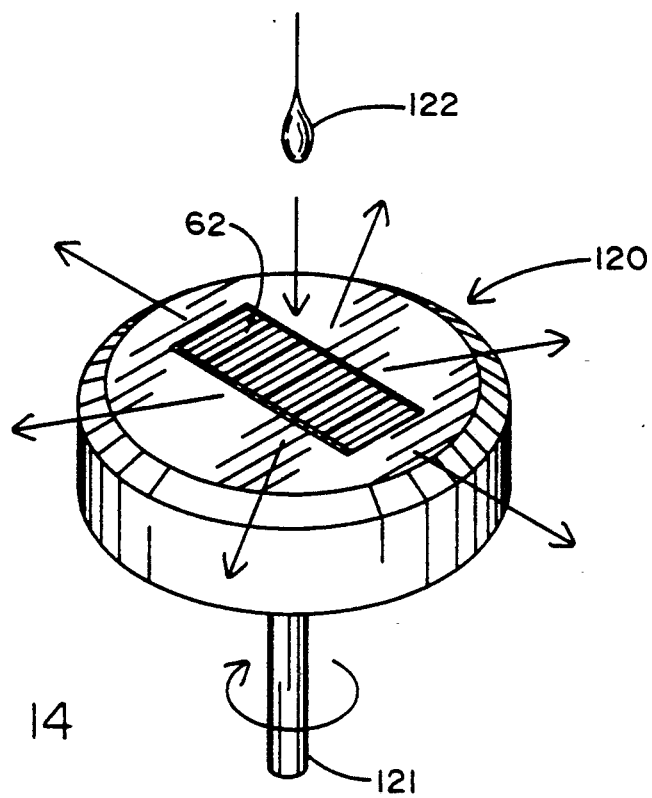
Figure 17:
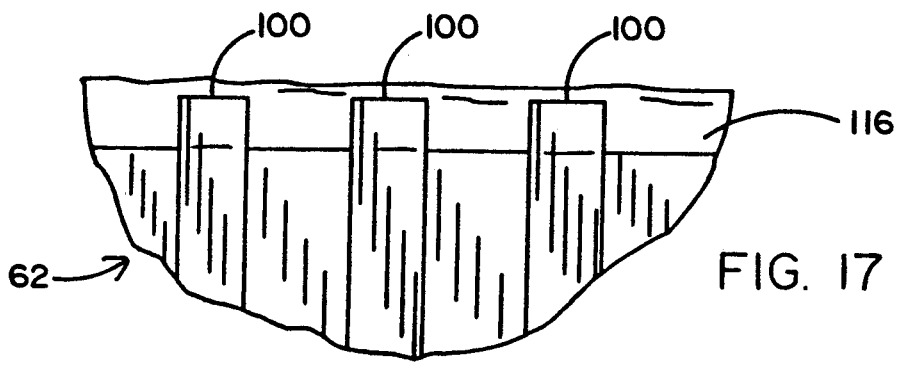

FIGS. 13 and 14 show a holding tool of the type used in applying the polyimide layers to the large stack 62. The large stack is placed in a recess 118 formed in a spinner 120. As shown in FIG. 14, rotation of a shaft 121 causes spinner 120 to rotate rapidly. The liquid polyimide material 122 is first dropped on the exposed face of large stack 62, and spinning is then started. The rapid rotation of spinner 120 cause the viscous liquid material to spread evenly over the face of the large stack. As stated above several layers of the passivation are spun on, until it covers the leads 100, as shown by the material 116 in FIG. 17.

Figure 18:
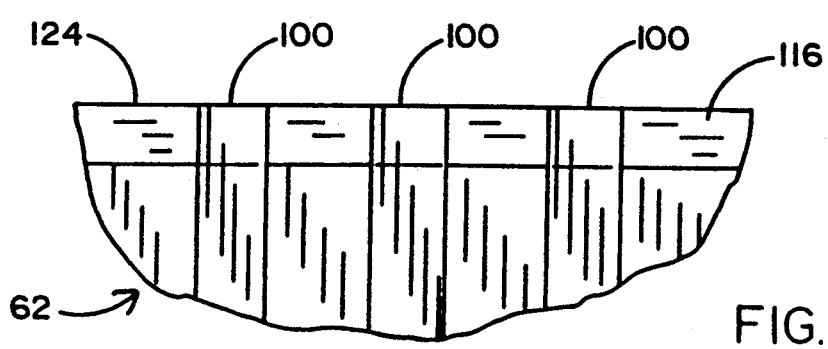

The next step is to mount the passivated large stack in a lapping fixture, such as that previously described, and then to remove enough passivation material to provide a planar surface 124 on which all the leads are exposed, as shown in FIG. 18. Lapping to form a hard flat surface provides a superior surface for later solder bump bonding or wire bonding. Periodically, during the lapping, the stack surface is inspected microscopically to determine the state of the lapped surface. When all of the metal lead extensions' end surfaces have been fully cleared of polyimide, the lapping is considered to be complete. The stack is then inspected for defects and corrective action taken where found necessary.

The passivated stack surface is next cleaned in preparation for deposition of metal pads to form T-connects (FIG. 1). After cleaning, the stack is ready for the application of lift-off photoresist. "AZ 4330" resist may be spun on the stack at 5000 rpm for 60 seconds, followed by a 30 minute softbake at 90° C. For the second layer, "AZ 4210" resist may be spun on at 7000 rpm for 60 seconds, followed by a 20 minute softbake at 90° C. The process of applying photoresist layers may use a spinner similar to that shown in FIGS. 13 and 14.

After applying photoresist, the stack is placed in an aligner, the pad mask is aligned to the stack, and the stack is exposed to UV for 5 seconds. The UV-exposed stack is then immersed for a sufficient time in a 1:4 water solution of "AZ 400k" developer at 23° C. After blow drying in nitrogen, the stack may be plasma ashed in a suitable gas mixture for one minute at 250 watts, in order to remove photoresist remnants.

The exposure mask(s) constitute an assembly of like arrays, one array for each short stack in the large stack. The mask must, of course, be aligned relative to the stack so that the pads are centered around the metal lead ends (i.e., where the T-connects are formed). Note that the pads are required only for testing of chips in the stack before the application of buslines to the stack. In some cases, chip measurement is considered to be an unwarranted extravagance, and pads are not needed. In that case, only buslines are used.

Figure 19:
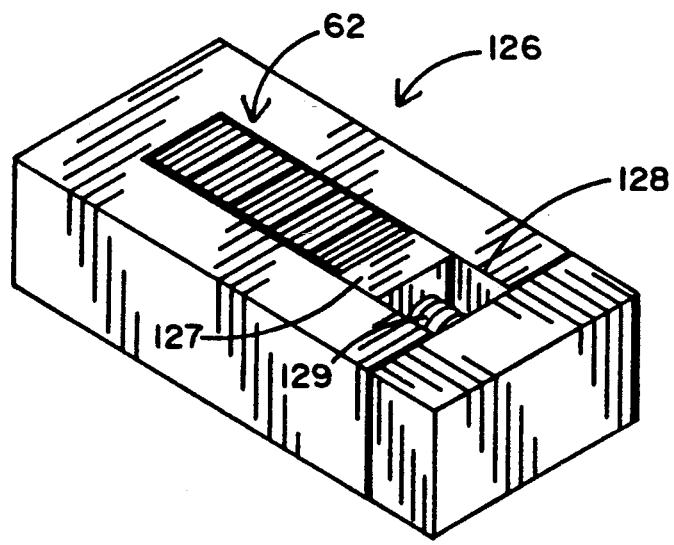
FIG. 19 shows a fixture in which the large stack is held while metalization is being applied to the access plane face of the large stack.

Metalization is preferably applied to the access plane face of large stack 62 by vacuum deposition in a sealed chamber. The chamber is not shown in the drawings, but FIG. 19 shows a metal holder 126 having a recess 128, in which large stack 62 is retained during the deposition process. Large stack 62 is retained in position by a block 127, which is engaged by a compression spring 129. The stack 62 has good thermal contact with the metal holder 126, which is placed on a substrate holder within the vacuum deposition system.

Vacuum deposition of metal may be accomplished either by evaporation, or by sputtering. As discussed in co-pending, common assignee application Ser. No. 07/955,461, evaporation may be preferred where lower temperature or faster deposition is desired.

However, in the process disclosed in this application, sputtering has generally been preferred. The sputtering may be performed in a low pressure argon atmosphere. First a $\approx 1500$ angstrom layer of Ti-W may be sputter-deposited, followed by a $\approx 10,000$ angstrom layer of sputtered Au. After removal from the metal holder 126, large stack 62 is soaked in acetone and then ultrasonically agitated in acetone to lift off the photoresist and extraneous metal.

Busline deposition follows the same process of cleaning, lithography and vacuum deposition as that described for metal pad deposition. Some variations might occur for the bus metallurgy: in several applications the bus metal may be Ti-W/CU/Au (1500:10,000:800 angstroms) instead of Ti-W/Au; other metal combinations may also be used.

The large stack fabrication has now been completed. What remains is separation of the large stack into multiple short stacks. It should be noted that high volume manufacture would probably use batch processing, in which each of the processes performed on the large stack 62 would be simultaneously performed on a plurality of large stacks. This would permit significant cost reduction of the final short stack products. For example, an array of large stacks, whose access planes are held in a common plane by means of "potting", may be successively processed by a projection stepper which relies on character recognition to correctly align the desired metallization.

Among the possible approaches to stack separation are: (1) dissolvable adhesive; (2) thermal shear/slide adhesive; (3) cleavage; and (4) sawing.

The dissolvable adhesive approach utilizes a specific adhesive between the chips where separation is intended. This adhesive must be soluble in a solvent that has no effects on the main adhesive. The viscosity of this special adhesive must be comparable to the viscosity of the main adhesive. In addition, the special adhesive must be able to withstand the chemical and thermal regimes used in the stack building process. Some experimentation has been carried out on this approach using a high vacuum leak sealant, "VACSEAL", a product of Space Environment Laboratories, Boulder Co. This material, a silicon resin, was chosen because of its very low vapor pressure in the cured state and ready dissolution after curing in either an acetate, ketone or ester solvent. It is stable over a wide temperature range; liquid helium temperature to 400° C. A full lamination, electrical isolation utilizing polyimide, and metalization, are used in fabricating the stack. A dicing saw is then used to make incisions in the polyimide insulation to allow interaction with the solvent, "Freon". After extensive soaking in heated "Freon", the sections are separated by placing a razor blade like edge at the subsection boundary and lightly tapping. This method can be described as a solvent-enhanced cleavage of the cured adhesive.

In the thermal shear/slide adhesive method, as in the one already described, a specific adhesive is required at the adjoining interfaces where separation is desired. However, in this case, the difference in thermal properties of the two adhesives is of the essence. This special adhesive must have low resistance to shear at some elevated temperature where the regular adhesive still maintains its resistance to separation. When the stack temperature is raised to some desirable range (e.g., on the order of 200° C.), then application of a shear force will cause the upper segments of the large stack to slide away from the lowest segment.

The cleavage method requires the separation to take place by cleaving through a silicon crystal chip. The silicon chip to be used for cleaving would be considerably thicker than other chips in the stack (three to four times). Certain planes in the silicon crystal fracture more readily than others, and are referred to as the preferential fracture planes, or cleavage planes. Such phenomena are a direct result of the atom packing density along a plane, such that a higher density of atoms will require more bonds to be broken, hence less chance of cleavage than on a low density plane. If separation can be initiated along one of the low density planes, then it will propagate along this plane and not affect other planes. To have this method succeed, the chip must have a crystal orientation that has its cleavage planes perpendicular to the stacking direction. It would also be necessary that cleavage be initiated from a thin groove running along the center of the chip edge. Such a cleavage groove can be produced by a wet anisotropic etch or by reactive ion etching. With a thin groove in the chips, fracture propagation can be carried out by means of a sharp steel or diamond blade, such as might be found in an ultra-microtome.

As briefly mentioned above, a new concept has been developed, in which adhesive between the end layers of adjacent short stacks loaded into fixture 52 (FIG. 6) may not be required. In this method, chips are stacked in the normal way, with the exception that no adhesive is used between the cap chips bounding each short stack. There are at least two alternative processes usable in this situation. One involves the use of a special large stack supporting fixture which retains the large stack as a unit during subsequent processing steps which modify the access plane of the large stack. The other involves the temporary use of adhesive between the short stacks, which adhesive is applied after the curing of the laminated large stack in fixture 52.

The first of the alternatives requires a special fixture (not shown) which holds the entire group of chips and which presents an exposed access plane (after lamination of the large stack). This allows lapping, etching lithography, metal deposition, and testing without removal of the full stack from the fixture. Upon completion of processing and testing, the "full" stack is removed from the fixture and segmented by pulling each short stack from the whole. Some light sanding of the enclosed sides may be required to facilitate removal, as well as cutting (e.g., by laser) the passivation polyimide between "short" stacks.

The second of the alternatives takes advantage of the relatively high curing temperature of the permanent, cured adhesive within the short stacks. After that adhesive has been fully cured, at temperatures in the range of 350° C. to 400° C., the short stacks can be temporarily glued together by a separation adhesive which will permit separation at much lower temperatures. In other words, the short stacks are glued together after the curing process, the subsequent processing steps are performed on the integrated large stack, and then the short stacks can be easily separated from one another.

At the present time, the preferred segmentation method is the use of thermal shear/slide adhesive. The separation adhesive has been chosen based upon its thermoplastic properties and the requirement that these properties will allow a shear force to separate a short stack from the large stack 62, if the shear force is applied at a time when the stack temperature is above 220° C. The permanent adhesive within the short stack must not be affected by the shear force at the shear temperature. In order not to damage the passivation polyimide (FIGS. 17 and 18) during segmentation, it is desirable to initially make a very fine cut with an excimer laser, removing the polyimide along the boundary where segmentation is to occur.

A suitable adhesive for use between separable layers of the large stack is sold under the trademark "Rely-Imide". Separation experiments were performed on chip couples to test several candidate materials for the role of separable adhesive. Two conditions for this material's use was that it must withstand 250° C. for several hours without degradation, and that it succumb to shear forces when heated to temperatures less than or equal to 220° C. The first of these conditions was required because of time and temperature regimes used for the stacking process. The second condition was necessary because of the 223° C. eutectic solder that would be coating the buslines at the time of separation, for later bonding to a substrate. Three adhesive materials were found to satisfy the two conditions. However, two of the three materials were found to have unacceptably high viscosities in stacking trails.

Figure 20:
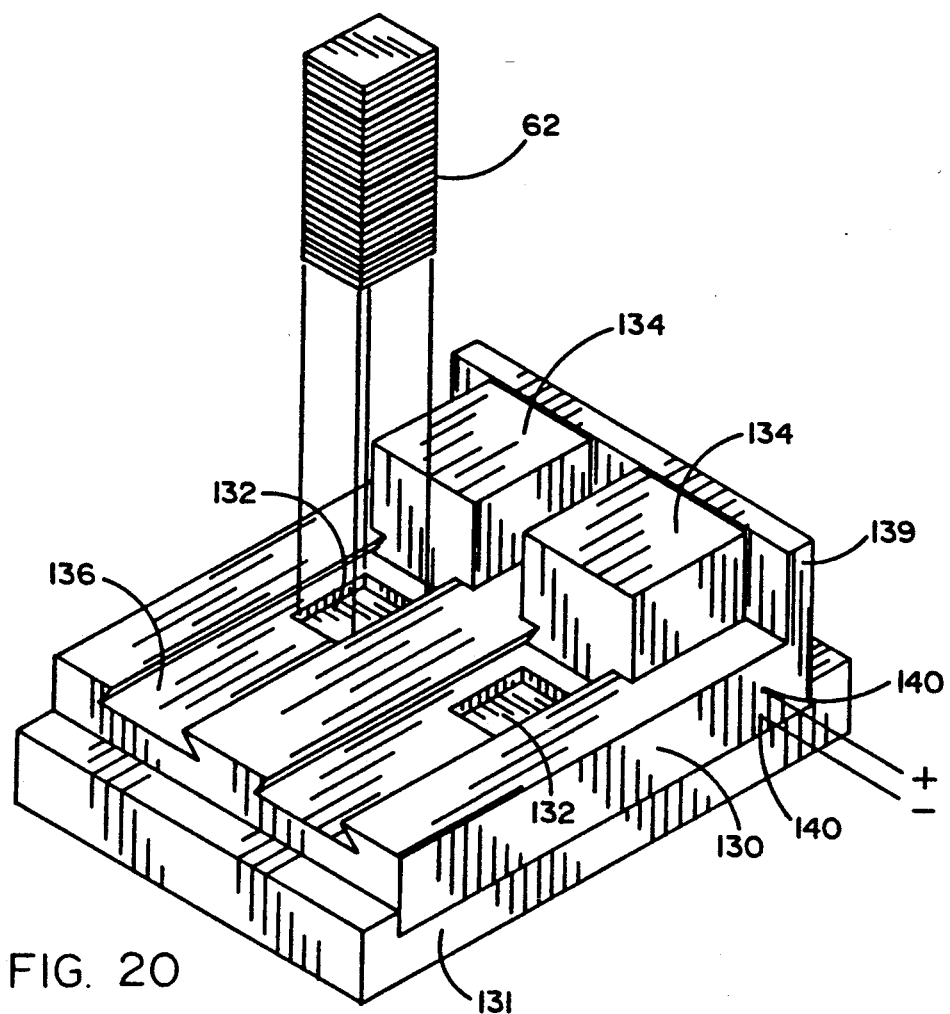
Figure 21:
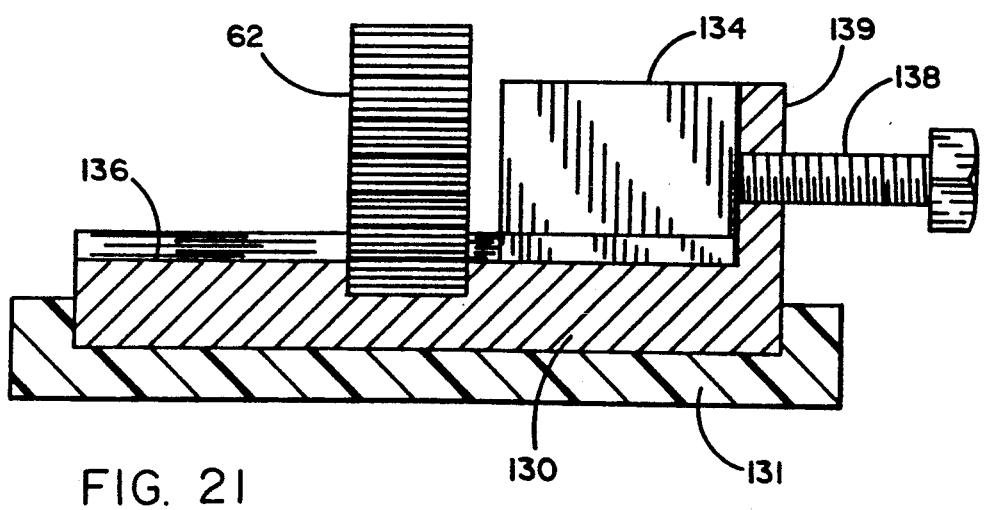

Various types of tools may be designed for use in segmenting the large stack to form a plurality of small stacks. FIGS. 20 and 21 show a simple segmentation tool. It comprises a metal plate 130 which has one or more small cavities 132. The large stack 62 is positioned with its lower end inside a cavity 132. The shear force which separates the small stack in the cavity from the remainder of the large stack is exerted against one side of the large stack by a metal driver block 134. The metal driver block is constrained to move in a track 136, which interlocks with the lower edges of driver block 134 in such a way as to prevent tilting of the driver block. Force which first moves driver block 134 into engagement with the large stack, and then causes shearing of the large stack, may be provided by a driving member 138, which is threaded through a vertical flange 139 integral with plate 130.

As stated above, it is necessary to heat metal plate 130, and thus the thermoplastic adhesive between short stacks, to an appropriate temperature. Metal plate 130, which is supported by a thermal insulating support 131, contains a heater rod (not shown) and holes 140 for thermocouple insertion. When the tool is heated by means of the immersed heater rod to the desired temperature, as determined by one of the inserted thermocouples, the shear force is applied to the stack. By having the large stack placed upright in the tool's cavity 132, the short stack to be separated is restrained from moving in the horizontal direction. The cavity depth is such that the top chip of the short stack is just above the following edge of the cavity, and just below the leading edge of the cavity. The tracked metal driver 143 is so positioned on the track that, in its horizontal motion, it makes contact with the large stack at a line just above the top of the cap chip belonging to the short stack undergoing separation.

Figure 22:
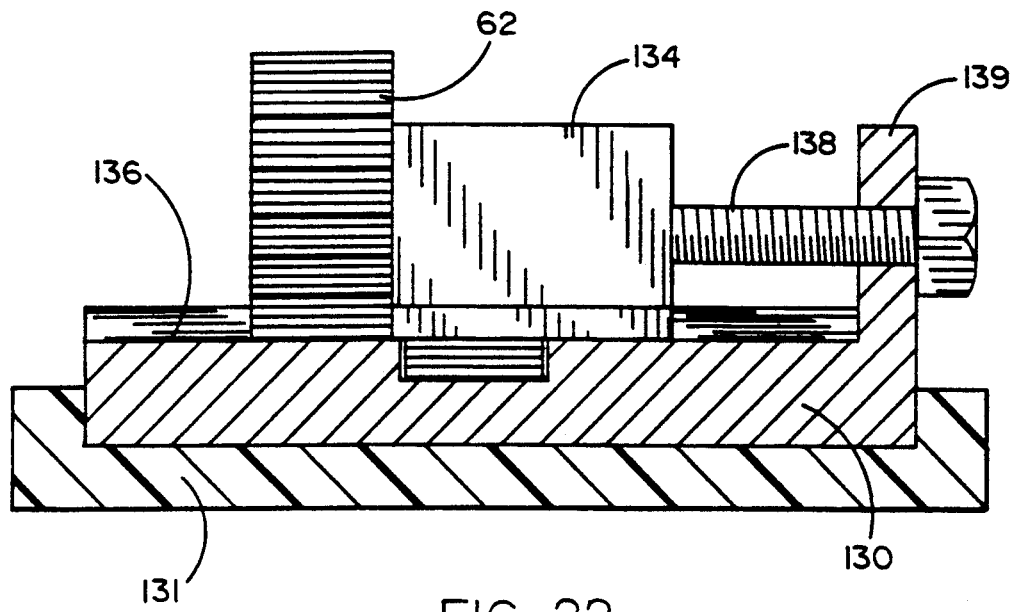
FIGS. 20-22 show an apparatus which may be used to segment the large stack into a plurality of small stacks, by separating one small stack at a time from the remainder of the large stack.

At separation temperature, the full stack is placed in the fixture, with the bottom stack in the machined cavity and the tracked driver 134 in contact with the full stack. The driver is then moved forward by rotating the end bolt 138. At some nominal shear force the static bond is broken and the full stack then moves across and over the short stack positioned in the cavity. FIG. 22 shows the large and small stacks after segmentation. After removal of the separated short stack from the cavity, the remaining full stack is again placed in the cavity. This sequence is repeated for each short stack until the full stack has been completely divided into short stacks. The separated stacks are then cleaned in a solvent that has been found to dissolve the separable adhesive. The short stacks are complete and ready for electrical testing.

From the foregoing description, it will be apparent that the method and apparatus disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A method for forming a stack containing IC chips for use as a dense electronic package having an access plane surface, which method comprises:
   forming a large stack containing a large number of IC chips, each of which chips includes both integrated circuitry and a multiplicity of electrical leads extending from such circuitry to the same edge of the chip;
   performing processing steps on the large stack to prepare the chip leads for connection to elements in an electronic system; and
   separating the large stack into a plurality of small stacks, each of which constitutes a module for use in an electronic system.

2. The method of claim 1 in which the chips are formed of semiconductor material, and the processing steps performed on the large stack include:
   etching one face of the large stack to cause the electrical leads thereon to extend beyond the face of the stack;
   applying passivation material to the etched face of the large stack, thereby covering the semiconductor chip material;
   removing sufficient passivation material to expose the ends of the electrical leads on the face of the large stack; and
   applying lead-contacting metalization to the face of the large stack.

3. The method of claim 1 in which:
   adhesive material of a first type is included in the large stack between each pair of adjacent chips intended for a given small stack; and
   adhesive material of a second type is included between adjacent chips in the large stack which will be separated from one another to provide the short stacks.

4. The method of claim 3 in which the adhesive material of the first type is more resistant to elevated temperatures than the adhesive material of the second type, and the stack separating process comprises:
heating the large stack to a temperature at which the adhesive material of the second type is weakened; and
exerting a shearing force which causes the weakened adhesive material to give way.

5. The method of claim 1 in which:
the large stack is mounted in a retaining fixture; and
the access plane surface of the large stack is lapped by abrasive material carried on a rotating wheel.

6. The method of claim 1 in which:
a thin layer of material is removed from the access plane surface of the large stack by an etching process.

7. The method of claim 6 in which:
the large stack is supported inside a sealed chamber; and
material is removed from the access plane surface of the large stack by plasma etching within the sealed chamber.

8. The method of claim 6 in which:
material is removed from the access plane surface of the large stack by dipping it into a liquid etching material.

9. The method of claim 1 in which:
the large stack is mounted in a rotating spinner; and
passivation material placed on the access plane surface of the large stack is caused by spinner rotation to be spread by centrifugal force over the surface of the stack.

10. The method of claim 1 in which:
the large stack is supported in a holding tool inside a sealed vacuum chamber; and
metalization is applied by a vacuum deposition process on the access plane surface of the large stack, said metalization having conductive engagement with the electrical leads extending from the integrated circuitry of the IC chips.

11. The method of claim 10 in which:
the vacuum deposition process for applying metalization is sputtering.

12. The method of claim 10 in which:
the vacuum deposition process for applying metalization is evaporation.

13. The method of claim 2 in which:
the large stack is mounted in a retaining fixture; and
the access plane surface of the large stack is lapped by abrasive material carried on a rotating wheel.

14. The method of claim 2 in which:
a thin layer of material is removed from the access plane surface of the large stack by an etching process.

15. The method of claim 2 in which:
the large stack is mounted in a rotating spinner; and
passivation material is applied to the access plane surface of the layer stack and then spread by spinner rotation.

16. The method of claim 2 in which:
the large stack is supported in a holding tool inside a sealed vacuum chamber; and
metalization is applied by vacuum deposition on the access plane surface of the large stack, said metalization having conductive engagement with the electrical leads extending from the integrated circuitry of the IC chips.

17. The method of claim 1 in which the large stack is formed by stacking individual layers, most of which are IC chips and some of which are not IC chips.

18. The method of claim 17 in which the layers in the large stack are so arranged that each small stack formed by segmentation has top and bottom layers which are not IC chips.

19. The method of claim 1 in which no adhesive is applied in the large stack between chips which constitute the end chips of adjacent small stacks.

20. The method of claim 19 in which:
the chips forming the large stack are supported in a special holding tool while the processing steps are being performed.

21. A method for forming a plurality of short stacks containing IC chip layers from a large stack of layers, which method comprises:
providing IC chip layers, each of which chips includes both integrated circuitry and a multiplicity of electrical leads extending from such circuitry to the same edge of the chip;
providing non-IC chip layers to serve as bottom and top layers of short stacks;
starting the large stack with a non-IC chip layer which is the bottom layer of a first small stack;
placing a plurality of IC chip layers above the bottom layer of the first small stack;
completing the first small stack with a top layer which is a non-IC chip layer;
starting a second small stack by adding to the large stack a non-IC chip layer which is the bottom layer of a second small stack;
placing a plurality of IC chip layers above the bottom layer of the second small stack;
completing the second small stack with a top layer which is a non-IC chip layer;
stacking IC chip layers and non-IC chip layers to provide a plurality of small stacks;
securing together with adhesive material all of the adjacent layers in a large stack;
said large stack having a planar access surface which contains the end of the electrical leads of the IC chip layers;
performing processing steps on the planar access surface of the large stack; and
thereafter segmenting the large stack to provide a plurality of individual small stacks.

22. The method of claim 21 in which:
permanent adhesive material is used between all adjacent layers within a given small stack; and
sacrificial adhesive material is used between the top layer of each small stack and the bottom layer of the next small stack.

23. The method of claim 21 in which the processing steps performed on the planar access surface of the large stack include:
applying passivation material to the planar access surface;
exposing the electrical leads on the planar access surface; and
applying metallization to the planar access surface, which is electrically connected to said electrical leads, and which provides electrical conduction from said leads to external circuitry.

24. A method for forming a plurality of short stacks containing IC chip layers from a large stack of layers, which method comprises:
- providing IC chip layers, each of which chips includes both integrated circuitry and a multiplicity of electrical leads extending from such circuitry to the same edge of the chip;
- providing non-IC chip layers to serve as bottom and top layers of short stacks;
- starting the large stack with a non-IC chip layer which is the bottom layer of a first small stack;
- placing a plurality of IC chip layers above the bottom layer of the first small stack;
- completing the first small stack with a top layer which is a non-IC chip layer;
- starting a second small stack by adding to the large stack a non-IC chip layer which is the bottom layer of a second small stack;
- placing a plurality of IC chip layers above the bottom layer of the second small stack;
- completing the second small stack with a top layer which is a non-IC chip layer;
- stacking IC chip layers and non-IC chip layers to provide the a plurality of small stacks;
- securing together with adhesive material all of the adjacent layers within a small stack, but not the top and bottom layers of adjacent small stacks;
- said large stack having a planar access surface which contains the ends of the electrical leads of the IC chip layers;
- performing processing steps on the planar access surface of the large stack; and
- thereafter segmenting the large stack to provide a plurality of individual small stacks.

* * * * *